METHOD OF MAKING A PROTECTIVE ELEMENT FOR HERMETICALLY ENCLOSED SEMICONDUCTOR DEVICES

Original Filed Sept. 7, 1965

INVENTORS
W.P. Perrin
J. Gentle

United States Patent Office
3,528,169
Patented Sept. 15, 1970

3,528,169

METHOD OF MAKING A PROTECTIVE ELEMENT FOR HERMETICALLY ENCLOSED SEMICONDUCTOR DEVICES

William P. Perrin, Richardson, and Joe Gentle, Prosper, Tex., assignors to Texas Instruments Incorporated, Dallas, Tex., a corporation of Delaware Original application Sept. 7, 1965, Ser. No. 485,207. Divided and this application Jan. 23, 1969, Ser. No. 810,431
Int. Cl. H01l 1/10
U.S. Cl. 29—588 5 Claims

ABSTRACT OF THE DISCLOSURE

Disclosed in a method of making a semiconductor device that includes a sealed envelope for enclosing a semiconductor body within an ambient atmosphere. This method includes the steps of securing a piece of boron anhydride glass to at least a portion of the inner surface of the envelope and securing the envelope to a header assembly so as to form a hermetically sealed semiconductor device wherein the piece of glass, which is spaced from the semiconductor body, minimizes the moisture content within the device.

This is a divisional application of Ser. No. 485,207, filed Sept. 7, 1965, now abandoned.

This invention relates to semiconductor devices and more particularly to an improved arrangement for encapsulating a semiconductor body and a desiccant material in a sealed envelope, and to a method for producing such an arrangement.

It is well known that the atmosphere surrounding a semiconductor device, for example a transistor, affects the performance and stability of the device. In mass-produced transistors, uniformity as well as stability are desired. Therefore the ambient atmosphere of a transistor should be one that not only enhances the performance and stability of the transistor, but should also be of a kind that is capable of being substantially reproduced for each separate transistor. This can be accomplished by encapsulating the transistor in a hermetically sealed envelope. The performance of a transistor operating in such an enclosed atmosphere can be further enhanced by also including a desiccant within the envelops.

It is therefore one object of this invention to improve the stability and reliability of semiconductor devices.

It is another object of the invention to inhibit the contamination of semiconductor device surfaces over long periods of time.

It is still another object of the invention to provide an easily repeatable process for encapsulating a semiconductor transistor device.

In accordance with these and other objects, features and improvements, the semiconductor device of this invention includes a hermetically sealed envelope enclosing said device, and ambient atmosphere, and boron anhydride glass which is fused to the interior of said envelope. Said boron anhydride glass acts as a desiccant to reduce the moisture content of the atmosphere enclosed within the envelope.

It is another feature of this invention to include within the hermetically sealed envelope in the remaining space unoccupied by the boron anhydride and the semiconductor body a silicone grease to enhance heat conduction from said semiconductor body.

The novel features believed to be characteristic of the invention are set forth in the appended claims. The invention itself, however, as well as other objects, features and advantages thereof may best be understood in reference to the following detailed description taken in conjunction with the appended claims and accompanying drawings, in which:

Figure 4:
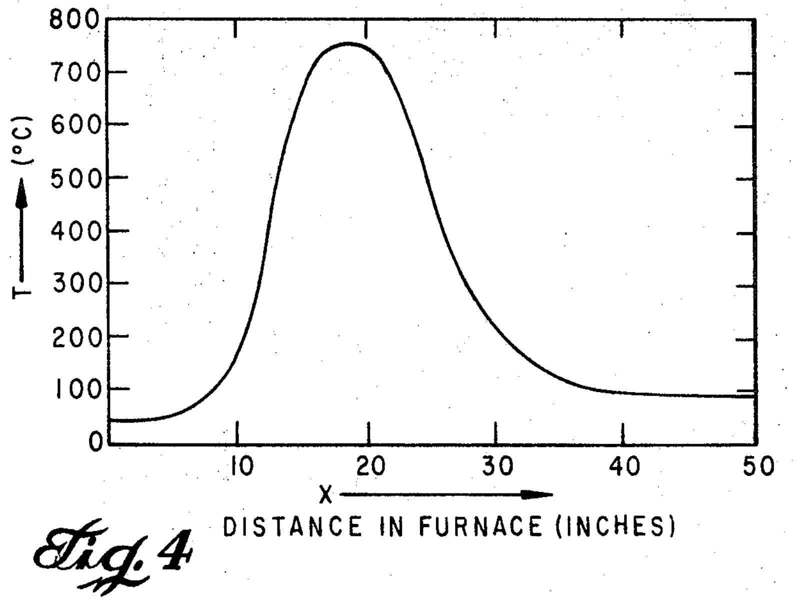

FIGS. 3*a* and 3*b* show schematically the cross-section of an encapsulation cap for a semiconductor device of the invention, with boron anhydride powder and boron anhydride glass, respectively, therein; and FIG. 4 is a graph showing the relation between temperature and distance through the furnace for the process step of firing the boron anhydride powder.

Figures 1, 3:
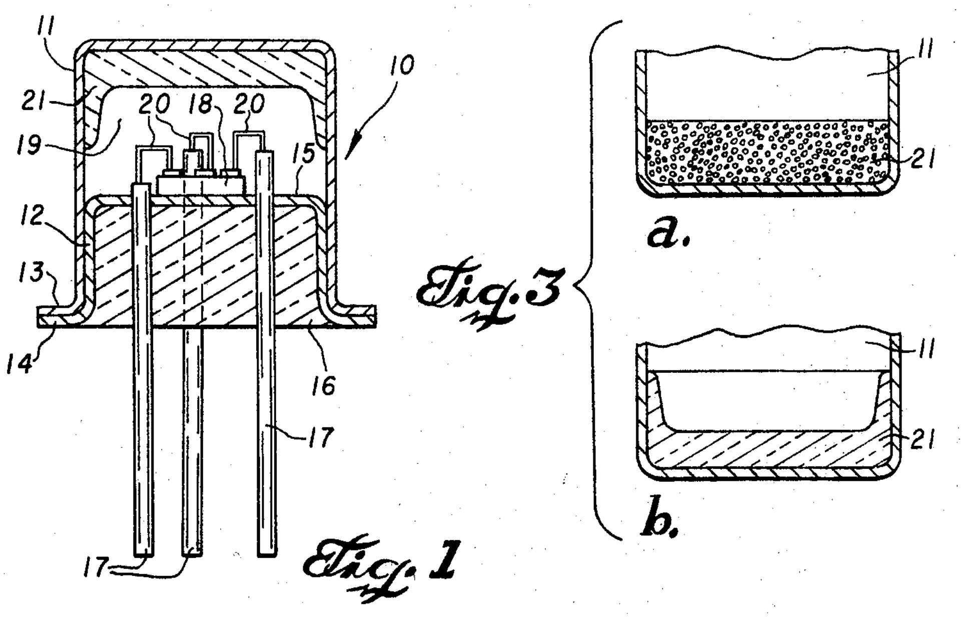
FIG. 1 shows schematically the cross-section of a semiconductor device in accordance with the invention.

Referring now to FIG. 1, the semiconductor device 10 includes an air-tight hermetic envelope of which a metal can 11 and a header assembly 12 form the basic parts. These two elements 11 and 12 are joined together by conventional welding techniques, either hot or cold, along a pair of flanges 13 and 14. The semiconductor body 18, a junction transistor, for example, rests upon the header assembly 12 which comprises a metal can 15, a fused glass insert 16 and a number of metal leads 17. Fine wires 20 provide contacts between the elements of the semiconductor body 18 and terminal leads 17.

The semiconductor body 18 is thus exposed to the atmosphere 19 enclosed within the envelope comprising the metal cap 11 and the header assembly 12. In accordance with the invention, boron anhydride glass 21 is fused to the top of the metal cap and extends along the sides of said cap. The boron anhydride glass 21 is introduced and fixed in the cap 11 by a process described in detail below. During said process, boron anhydride powder is heated to such a degree that it fuses to form the boron anhydride glass. Two other objects of this heating process are to promote wetting of the boron anhydride glass so that it will extend up the sides of the cap 11 (the cap being turned upside down during the heating), and drive off any water that might be present in the boron anhydride powder before firing. Boron anhydride glass is very hygroscopic and therefore reduces the moisture content within the enclosed atmosphere 19 to a minimum. It is not known whether the resulting atmosphere is completely dry or whether there remains a certain amount of moisture content. However, this encapsulation including the anhydride glass results in improved stability and reliability of performances, and as will be shown below, can be easily repeated, making it suitable to be used in the mass production of semiconductor devices.

In another embodiment of the invention the enclosed space region 19 is filled with a silicone grease. The purpose of this added feature is to enhance heat conduction from the semiconductor body 18. A suitable substance by way of example is a material commercially identified as Dow-Corning "DC-200" Silicone Fluid, fully disclosed in a booklet entitled Dow-Corning Silicone Notebook, Reference No. 2003, Dow-Corning 200 Fluids. As disclosed in the publication, the Dow-Corning 200 Fluids are dimethyl polysiloxanes in which dimethyl siloxane units are linked together to form chains of varying length represented by the formula $$CH_3-\underset{CH_3}{\overset{CH_3}{\underset{|}{\overset{|}{Si}}}}-\left[O-\underset{CH_3}{\overset{CH_3}{\underset{|}{\overset{|}{Si}}}}-\right]_n O-\underset{CH_3}{\overset{CH_3}{\underset{|}{\overset{|}{Si}}}}-CH_3$$

The fluids made up of these chains remain fluid at room temperature even though $n$ may range from zero (0) to 2000 or more. The viscosity of the fluid is determined by the average length of the chain. Adding an ingredient such as zinc oxide (ZnO), or aluminum trioxide ($Al_2O_3$) so that said ingredient constitutes 40–80% of the mixture by weight, further enhances the thermal conduction from the semiconductor body 18. It is to be noted that whether or not the silicone grease is used, the desicant material, boron anhydride glass does not come in contact with the semiconductor body, thus insuring tht the glass does not contaminate the active semiconductor regions.

Figure 2:
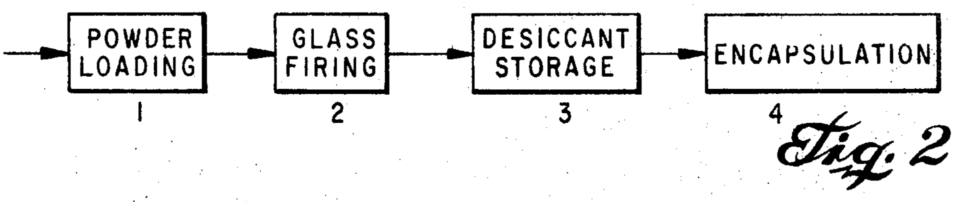
FIG. 2 represents a flow diagram for the process of producing the semiconductor device illustrated in FIG. 1.

The process of preparing the encapsulation for the semiconductor device of the invention is illustrated by the flow diagram shown in FIG. 2. Four stages are shown, these being (1) a powder loading stage, (2) glass firing stage, (3) desiccant storage stage, and (4) encapsulation stage.

Powder loading, shown in stage (1), should be done in a controlled humidity atmosphere. By controlled humidity is meant that the atmosphere should be kept as dry as possible. Dry boron anhydride powder is loaded into envelope caps 11 shown in FIG. 1. Keeping the moisture level of the powder at a minimum is desirable for two reasons; one is thta a violent reaction can take place in firing if moisture is present, and second, a dry powder is much easier to load into the caps. The volume of powder used may be about 0.023 $cm.^3$, although this volume, of course, can be adjusted to meet specific needs.

The next stage (stage (2) in FIG. 2) is the glass firing stage during which the powder is fused to form boron anhydride glass. FIG. 3*a* and 3*b* show the encapsulation caps 11, at two stages of the firing process. In FIG. 3*a*, the boron anhydride powder 21 is shown as packed into the caps 11. FIG. 3*b* shows the final arrangement after firing where the boron anhydride powder 21 in FIG. 3*a* has fused to form boron anhydride glass 21.

The cup-shaped configuration of the glass 21 is a result of wetting. By this it is meant that the glass, instead of beading up, spreads smoothly across the bottom of the caps, into the corner between the bottom and the side, and extends up the side of the cap 11. This wetting is desirable for several reasons: (1) it insures that there is clearance for the semiconductor body 18 and leads 17 as shown in FIG. 1; (2) it exposes a maximum amount of boron anhydride glass surface to the atmosphere 19 in the interior of the encapsulation envelope, as shown in FIG. 1; and (3) it provides a stronger bond between the glass 21 and the metal cap 11, as shown in FIG. 1, thus insuring that in case of rough handling the glass will not separate from the metal cap 11 and contaminate the semiconductor body 18.

Good results have been obtained in the firing of the boron anhydride powder by submitting it to the temperature profile shown in FIG. 4. The temperature profile was obtained by plotting the temperature against the distance through the firing furnace, a conventional one heat zone conveyor furnace. The belt speed through the furnace, that is the rate at which the encapsulation caps 11 as shown in FIG. 3*a*, were moved through the furnace, was 2 inches per minute. While this temperature profile and chain speed have given good results, they are not to be considered in a limiting sense. These conditions will vary somewhat depending on the individual characteristics of the particular furnace used.

It is also desirable that the powder be fired under a nitrogen atmosphere. By this it is meant that the powder is only exposed to a nitrogen atmosphere from the moment it enters and until it leaves the furnace. Thus, a good quality of glass that is clear, well-wetted and free of bubbles was produced when the firing temperature was between 760–800° C. and a nitrogen atmosphere was maintained during firing.

Stage (3) in FIG. 2 represents the storage of the encapsulation cap and fused desiccant therein. Although not an essential step in the fabrication process of the invention, it will usually be included as the caps 11 are normally not used immediately after firing. The requirement of the storage stage is to prevent the fused desiccant from contacting room atmosphere and thus absorbing moisture. This is done by unloading the caps directly from the furnace to containers which are purged with nitrogen. These containers are held at a higher than room temperature, i.e., 100–150° C. and are then sealed. When the containers are stored and cooled, the caps are in a reduced pressure nitrogen atmosphere.

The seal on the storage container is not broken until the time for welding the cap 11 in FIG. 1 to the header arrangement 12, also shown in FIG. 1. At this time, the vcauum seal of the container is broken inside a welding box. The welding box should have a controlled atmosphere that is kept as dry as possible. However, there will undoubtedly be some moisture present in this controlled atmosphere. As this atmosphere will constitute the ambient atmosphere 19 in FIG. 1, within the sealed envelope, the less moisture present during welding the less the boron anhydride glass will have to remove from the atmosphere 19. As a completely dry controlled atmosphere is difficult to obtain, the optimum degree of control will depend upon the required specifications of the finished device.

Before the final welding, the silicon grease DC–200 can be introduced into the encapsulation cap 11, if so desired.

Various modifications of the disclosed embodiment and disclosed process, as well as other embodiments of the invention, will become apparent to persons skilled in the art without departing from the spirit and scope of the invention as defined by the appended claims.

What is claimed is:

1. A method of fabricating a semiconductor device including the steps of:

(a) loading boron anhydride powder into an encapsulation cap;

(b) firing the powder within said cap to form boron anhydride glass and fuse said glass to the interior of said cap; and (c) welding said cap to a header assembly to form a hermetically sealed envelope enclosing a semiconductor body.

2. A method of fabricating a semiconductor device according to claim 1 wherein said glass when fired flows up the side of said encapsulation cap.

3. A method of fabricating a semiconductor device including the steps of:

(a) loading boron anhydride powder into an encapsulation cap under a controlled humidity atmosphere;

(b) firing said powder in a furnace under a nitrogen atmosphere to form boron anhydride glass that fuses to said cap;

(c) storing said cap under a reduced nitrogen atmosphere; and (d) welding said cap under a controlled atmosphere to a header assembly to form a hermetically sealed envelope enclosing a semiconductor body.

4. A method of fabricating a semiconductor device according to claim 1 including the step of introducing before welding said cap to said header a composition consisting essentially of the mixture of silicone fluid with 40% to 80% by weight of a metal oxide from the group consisting of ZnO and $Al_2O_3$, said silicone fluid being of the type represented by the formula:

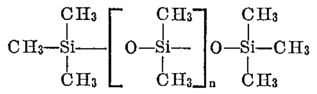

where $n$ is an integer from zero (0) to 2000 to enhance the heat conduction from the semiconductor body into the encapsulation cap.

5. A method for fabricating a semiconductor device according to claim 1 wherein the firing of the powder in step (b) is effected at a temperature from about 760° C. to about 800° C.

References Cited

UNITED STATES PATENTS

| | | | |
|---|---|---|---|
| 3,376,376 | 4/1968 | Smith | 29—588 X |
| 3,381,369 | 5/1968 | Stoller | 29—588 |
| 3,442,993 | 5/1969 | Yamamoto et al. | 29—588 |

PAUL M. COHEN, Primary Examiner

U.S. Cl. X.R.

29—472.9